United States Patent [19]

Stuebing et al.

[11] Patent Number: 5,809,410
[45] Date of Patent: Sep. 15, 1998

[54] LOW VOLTAGE RF AMPLIFIER AND MIXED WITH SINGLE BIAS BLOCK AND METHOD

[75] Inventors: Carlton Stuebing; Richard Douglas Schultz; Thomas David Brogan, all of Palm Bay; Sang-Gug Lee, Melbourne, all of Fla.

[73] Assignee: Harris Corporation, Melbourne, Fla.

[21] Appl. No.: 90,617

[22] Filed: Jul. 12, 1993

[51] Int. Cl.[6] .................................................. H04B 1/28
[52] U.S. Cl. ......................... 455/333; 455/318; 455/326
[58] Field of Search .................................. 455/333, 313, 455/318, 323, 325, 326, 234.1; 331/46, 108 R, 108 A; 330/296, 289, 200, 278, 282, 284; 327/113, 355, 356

[56] References Cited

U.S. PATENT DOCUMENTS

| | | | |
|---|---|---|---|
| 3,497,822 | 2/1970 | Beurrier | 330/296 |
| 3,500,222 | 3/1970 | Kozawa et al. | 330/284 |
| 3,849,677 | 11/1974 | Stacey et al. | 327/552 |
| 4,344,188 | 8/1982 | Tanabe et al. | 455/326 |
| 4,419,632 | 12/1983 | Morris | 330/296 |
| 4,480,337 | 10/1984 | Graziadei et al. | 455/333 |
| 5,105,165 | 4/1992 | Bien | 330/149 |
| 5,150,076 | 9/1992 | Asazawa | 330/296 |
| 5,166,645 | 11/1992 | Watts | 455/333 |
| 5,252,866 | 10/1993 | Kimura | 455/333 |
| 5,268,649 | 12/1993 | Jones | 330/296 |
| 5,323,123 | 6/1994 | Philippe | 455/333 |
| 5,352,992 | 10/1994 | Asazawa | 330/296 |
| 5,357,089 | 10/1994 | Prentice | 330/289 |
| 5,379,457 | 1/1995 | Nguyen | 455/333 |
| 5,422,522 | 6/1995 | Rotay | 330/296 |

FOREIGN PATENT DOCUMENTS

| | | |
|---|---|---|
| 0463857 | 1/1992 | European Pat. Off. . |
| 0498221 | 8/1992 | European Pat. Off. . |
| 3329664 | 3/1985 | Germany . |
| 53-39811 | 4/1978 | Japan ........... 455/333 |
| 59-22406 | 2/1984 | Japan ........... 455/333 |
| 4253409 | 9/1992 | Japan ........... 455/333 |
| 8503435 | 7/1987 | Netherlands ........... 455/333 |
| 1517116 | 10/1989 | U.S.S.R. ........... 455/333 |
| 2243965 | 11/1991 | United Kingdom ........... 455/333 |

OTHER PUBLICATIONS

Alan B. Grebene, "Bipolar and Mos Analog Integrated Circuit Design", New York, 1984, pp. 415–417.
David K. LoveLace, "Silicon Mosfets Power Gilbert–Cell Mixers",Microwave X RF, Apr. 1993, pp. 59–60.
Wes Hayward and Doug Deman, "Solid State Design for the Radio Amateur", Newington, CT., 1986, pp. 7–16, pp. 111–115.
Watkins–Johnson Company, RF and Microwave Components Designer's Handbook, 1990, pp. 357–366, pp. 689–702.
Paul R. Gray and Robert G. Meyer, "Analysis and Design of Analog Integrated Circuits", NY, 1977, pp. 236–239, pp. 254–261, pp. 561–575.
Optimax, Inc. Triax Catalogue, "RF Microwave Attenuators . . . ", Hatfield, PA., pp. 3–224–3–227.

*Primary Examiner*—Nguyen Vo
*Attorney, Agent, or Firm*—Rogers & Killeen

[57] ABSTRACT

A single bias block for a single or multiple low voltage RF circuits including one or more amplifiers and one or more single or double balanced mixers with compensation for temperature and integrated circuit process parameters. The power supply may be a lower voltage without sacrificing the dynamic range of the amplifier and/or mixer by applying full power supply voltage to the load with the bias applied to the base circuit through an operational amplifier and/or buffer circuit. For the mixer, a lower noise figure may also be realized by moving the gain control impedance from the emitter to the collector circuit. The circuits may be discrete components or part of an integrated circuit. Methods are disclosed for reducing the power supply voltage without affecting the dynamic range of an amplifier, for temperature and process parameter compensation, and for controlling the gain of a mixer without affecting input or output impedance.

1 Claim, 5 Drawing Sheets

LOW VOLTAGE RF AMPLIFIER AND MIXED WITH SINGLE BIAS BLOCK AND METHOD

BACKGROUND OF THE INVENTION

The present invention relates to low voltage RF amplifiers and mixers and to the integration thereof into a semiconductor circuit in which a single bias block may serve multiple low voltage RF circuits with compensation for both temperature and semiconductor process parameters.

With reference to the drawings, and particularly FIG. 1, radio frequency amplifiers are well known and in common use. Such amplifiers generally operate at high voltage, e.g., 12 to 15 volts, in a common emitter (i.e., a.c. grounded emitter) configuration.

With respect to prior art radio frequency amplifiers, and as shown in FIG. 1, a radio frequency input signal RF may be applied to an input terminal 20 across a coupling capacitor to the base electrode of a NPN transistor Q1. The collector electrode is connected to the bias circuit through a load resistor $R_L$. The amplified output voltage signal may be taken from the collector electrode of the transistor Q1 and applied across a coupling capacitor to an output terminal 22.

The bias circuit for the amplifier illustrated in block form in FIG. 1 may conventionally take several forms as shown in FIGS. 2 and 3 and as disclosed in greater particularity in Heyward and DeMaw, *Solid State Design For The Radio Amateur*, American Radio Relay League, Inc. Newington, Conn. 1986. (See pp. 11–12, FIGS. 13 & 14) In the bias circuit of FIG. 2, temperature stability is enhanced by the use of a transistor, and in FIG. 3 by the use of an operational amplifier.

As is well known, the voltage on the collector electrode of a common emitter amplifier at zero collector current applies a constraint on the upper end of its dynamic range. Dynamic range affects interference with other frequency channels because of the overtones produced as a result of the gain compression when voltage clipping begins. As a result of the voltage drop across the bias circuit in the amplifier of FIG. 1, the maximum voltage which can be applied to the load resistor is much less than Vcc, typically about 0.6 Vcc.

More recently, and as shown, for example, in the U.S. Pat. No. 5,105,165 dated Apr. 14, 1992, it has been proposed to bias the base of a RF amplifier rather than the emitter thereof where the emitter includes an inductor. However, the bias of such amplifiers does not include means for buffering the bias circuit transistor from the effects of loading.

It is accordingly an object of one aspect of the present invention to provide a novel low voltage RF amplifier circuit and method that obviates an important limitation on the dynamic range of the prior art in low voltage power supply applications.

It is a further object of the present invention to provide a novel amplifier and method of reducing the loss of dynamic range resulting from gain compression.

It is another object to provide a novel method and circuit for minimizing overtone interference in a RF amplifier.

It is another object of the present invention to provide a novel method and circuit to reduce gain compression in a RF amplifier without significant reduction of the noise figure.

It is yet a further object of the present invention to provide a novel amplifier and method of buffering the bias from the effects of loading.

It is yet another object of the present invention to provide a novel method and circuit to temperature compensate a low voltage amplifier.

Mixers are commonly used in RF communications to frequency upshift a low frequency information signal (e.g., an audio frequency signal) to a radio frequency for transmission, and to frequency downshift the received radio frequency signal. One single balanced active prior art mixer is illustrated in FIG. 6 where a local oscillator signal LO is mixed with a radio frequency signal RF to provide an intermediate frequency signal IF. As illustrated in FIG. 6, the bias for the mixer may be, but need not be, provided by a current source in the emitter circuit of the transistor Q3 with the gain control resistor $R_G$.

As is well known, the noise figure of a mixer is the signal-to-noise ratio of the output signal over the signal-to-noise ratio of the input signal. The resistor $R_G$ controls the gain of the transistor Q3 and thus affects the dynamic range of the circuit. In addition, and because it is in the emitter circuit of the RF transistor Q3, it also affects the input impedance and the noise figure of the mixer.

It is accordingly an object of another aspect of the present invention to provide a novel mixer and method that obviates an important limitation on the dynamic range of prior art mixers.

It is a further object of the present invention to provide a novel circuit and method of controlling the gain of a mixer without impacting the noise figure of the circuit.

It is another object of the present invention to provide a novel method and circuit to improve a.c. stability of a mixer by reducing the gain of the transistor in the voltage-to-current converter without significantly degrading the noise figure.

In double balanced mixers, the prior art as illustrated e.g., in FIG. 8, typically locates the gain control resistor $R_G$ in the emitter circuits of the two RF amplifier transistors Q5 and Q6 and may require two complementary radio frequency input signals RF and $\overline{RF}$. The generation of a complimentary RF input signal in turn may require the use of expensive balan input transformers.

Where two RF input signals are not desired (i.e., an unbalanced mixer), the terminal 28 in FIG. 8 may be grounded, and the $\overline{IF}$ and IF output signals combined (in a circuit not shown) with an appropriate phase shift to avoid the loss of power inherent in the non-use of an available output signal. Such combining generally results in a significant loss of bandwidth.

It is another object of the present invention to provide a circuit and method of unbalancing a mixer without significant loss of power and/or loss of bandwidth.

It is accordingly an object of another aspect of the present invention to provide a novel mixer and method that obviates the effects of gain control on the noise figure.

Base-collector capacitor compensation of the LO transistors is inherently provided by double balanced mixers such as shown in FIG. 8. Such compensation negates $C_\mu$ and improves the switching of the local oscillator transistors, making them more efficient and increasing the intercept point. However, in a single balanced mixer, the absence of the second pair of cross-connected transistors slows LO switching.

It is accordingly an object of the present invention to provide a novel circuit and method for compensating single balanced and unbalanced mixers.

It is also known to use a single bias block to provide bias for multiple analog circuits, as it has particular advantage in integrated circuits where lower die size, process independence and efficient use of power are desired. For example, and as shown in FIG. 13, a single bias block may comprise a power supply Vcc connected across a constant current source, two transistors and a resistor to provide a bias voltage for multiple analog voltage amplifiers in other than a common emitter or a.c. grounded emitter configuration. Examples of such low voltage bias amplifiers and ECL gates are discussed, e.g., in Gray and Meyer, *Analysis And Design Of Analog Integrated Circuits*, John Wiley & Sons, Inc. 1977 (See p. 236, FIG. 4.22). While such bias circuits offer immunity to injected power supply noise because the loads are differential, such differential circuits provide relatively poor noise figure performance and thus are not well suited for RF circuits.

It is accordingly an object of one aspect of the present invention to provide a novel single bias block and method that obviates many of the limitations of the prior art and the effects of a low voltage power supply on the dynamic range of plural circuits.

It is another object of the present invention to provide a novel single bias block and method of providing bias for plural common emitter circuits such as amplifiers and mixers.

As is well known, the gain of an amplifier is dependant on the operating temperature of the semiconductors in the circuit as well as process parameters. By way of example, a 1° C. increase in the temperature of the integrated circuit die temperature results in a −2.2 millivolt change in the base-to-emitter voltage $V_{BE}$.

The effects of β and $V_{BE}$ mismatch are substantially reduced with emitter resistor degeneration, and degeneration improves a.c. stability and reduces gain, but degrades the noise figure. Furthermore, transistors on the same die, at the same temperature, the same bias conditions and designed to have identical characteristics may mismatch and, provide collector currents with a 30% variation due to mismatched β.

As shown in FIG. 13, it is also known to compensate for these parameters in circuits with resistors in the emitter circuits by use of a "mirror" circuit in which a semiconductor transistor device subject both to the same operating temperature and process parameters is used as a sensor to adjust the reference voltage applied to the operational amplifier which controls conduction of the operative circuit. However, such techniques are obviously not applicable to common emitter RF stages because of the lack of an emitter resistor and because of the importance of the noise figure.

It is accordingly an object of one aspect of the present invention to provide a novel single bias block and method that obviates many of the problems of the prior art by the use of a reference circuit to adjust the output signal of the operational amplifier which controls the conduction of the operative circuit via its base current.

It is a further object of the present invention to provide a novel single bias block and method of providing bias for a single or multitude of common emitter amplifier stages where bias control from the base terminal is desired.

It is another object of the present invention to provide a novel single bias block and method of providing bias for a single or multitude of common emitter mixer stages where the gain of the circuit is controlled by the trimming, e.g., by laser, of a gain control resistor in the collector circuit, so that the noise figure, input impedance are not affected. It is a further object of the present invention to provide a novel single bias block and method of providing temperature compensation for plural common emitter circuits such as amplifiers and mixers.

These and many other objects and advantages will be readily apparent to one skilled in the art to which the invention pertains from a perusal of the claims, the appended drawings, and the following detailed description of preferred embodiments.

DESCRIPTION OF PREFERRED EMBODIMENTS

Base Biased Amplifier

Figure 1:
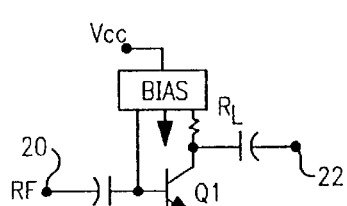
FIG. 1 is a schematic circuit diagram of a prior art high voltage RF amplifier showing the bias circuit in block diagram form.
Figure 2:
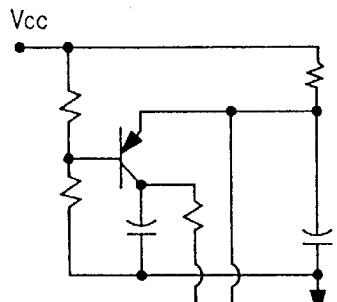
FIG. 2 is a schematic circuit diagram of a first prior art active bias circuit which may be used in the high voltage amplifier of FIG. 1.
Figure 3:
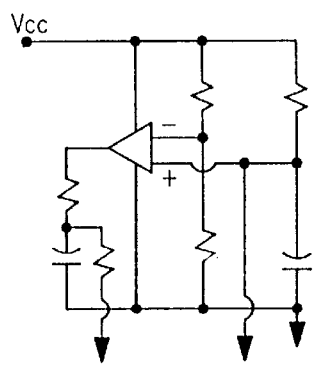
FIG. 3 is a schematic circuit diagram of a second prior art active bias circuit which may be used in the high voltage amplifier of FIG. 1.
Figure 4:
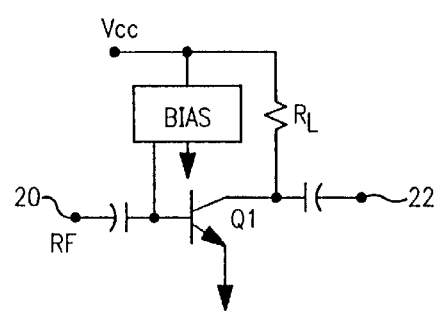
FIG. 4 is a schematic circuit diagram of the low voltage RF amplifier of the present invention with the bias circuit illustrated in block form.

With reference now to FIG. 4, where like numerical designations have been used to facilitate a comparison with the prior art of FIG. 1, the load $R_L$ in the collector circuit of the transistor Q1 is directly connected to Vcc rather than through the bias circuit. In a practical low voltage application, the voltage drop of the bias circuit may be forty percent of Vcc or more, and the direct connection of the load to Vcc thus significantly increases the voltage available across the load and the RF transistor. This increase in available voltage greatly increases the dynamic range of the amplifier. Conversely, the amount of power needed to provide a desired dynamic range is significantly reduced.

Note that the load may be internal of the amplifier and in the same integrated circuit, external of the IC, or a combination thereof.

It is necessary to protect the bias circuit from the effects of the loading of the transistor Q1, particularly where temperature compensation of the bias is desired. In the preferred embodiment illustrated in the right hand portion of FIG. 5, the buffer is provided by a suitable conventional operational amplifier 24 to which is applied a voltage reference $V_R$. As discussed below in connection with temperature compensation, the voltage reference may be derived from a simple resistor divider between the power supply and ground or circuit common. Alternatively, the reference signal may be derived from a power supply independent source such as a bandgap, or other reference circuit with the desired temperature coefficient.

The output signal from the operational amplifier 24 is used to bias the transistor Q in the feedback loop as well as the base of the RF amplifier transistor Q1 through a variable resistor 30. As discussed infra, the output signal from the operational amplifier 24 may also be applied to the base of the transistors Q2-QN in a plurality of other grounded emitter, RF devices such as the amplifiers shown in FIG. 5.

Base Biased Mixer

Many aspects of the present invention are applicable to single balanced mixers as well as unbalanced and double balanced mixers.

Figure 6:
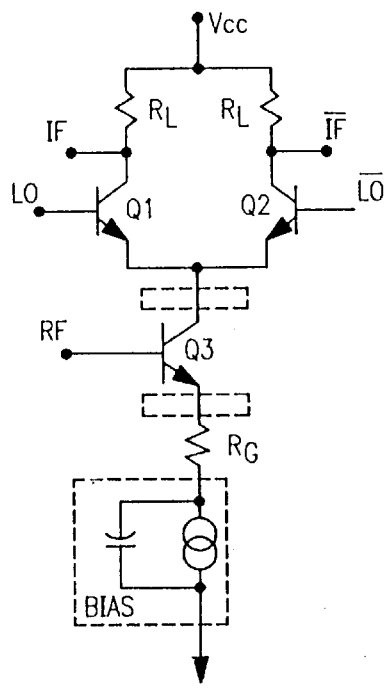
FIG. 6 is a schematic circuit diagram of a prior art single balanced mixer.
Figure 7:
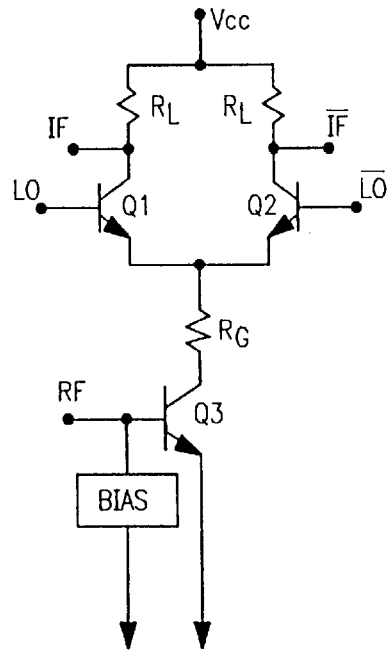
FIG. 7 is a schematic circuit diagram of the single balanced mixer of the present invention.
Figure 10:
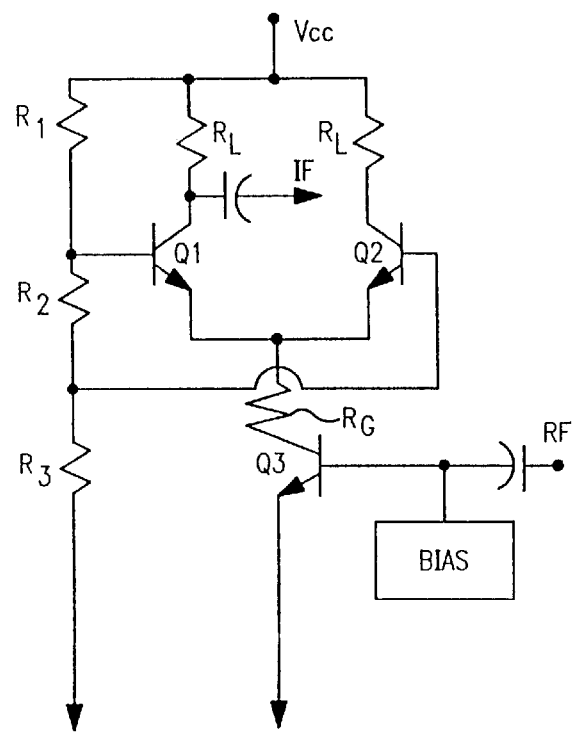
FIG. 10 is a schematic circuit diagram of an unbalanced mixer of the present invention.

As shown in the single balanced mixer of FIG. 7, where like elements have been accorded like reference designations to facilitate a comparison with the prior art single balanced mixer of FIG. 6, the current source bias for the mixer has been removed from the emitter circuit of the transistor Q3 and the bias circuit of the present invention connected to the base thereof. In addition, the gain control resistor $R_G$ has been relocated from the emitter circuit of the transistor Q3 to the collector circuit thereof.

Since the noise figure of the mixer is substantially a function of any resistive noise sources at the base and emitter of Q3 in FIG. 6, any reduction or elimination of resistive noise sources will improve the noise figure. The reason that Q3 is sensitive to noise sources at its base and emitter is that those noise sources are amplified by the power gain at Q3. Relocation of $R_G$ from the emitter of Q3 in FIG. 6 to the collector of Q3 of the RF amplifier in FIG. 7 will therefore improve the noise figure.

The gain of a mixer is substantially a function of $R_L$ and $R_G$. One typically has little control over $R_L$, leaving only $R_G$ as a means to decrease the gain. As discussed previously, using $R_G$ in the emitter degrades the noise figure. By re-locating this resistor to the collector of Q3 in FIG. 7, mixer gain can be reduced by utilizing the Miller capacitance effect. This gain reduction is only applied to frequencies above the pole determined by the Miller capacitance, making the topology of FIG. 7 appropriate for RF applications. In this way the limitation on the dynamic range of the circuit is obviated and gain can be controlled and a.c. stability improved significantly without impacting the noise figure of the circuit.

While suggested in FIG. 6, a reactive circuit may be added either to the collector or emitter circuits of the transistor Q3 in FIG. 6 and FIG. 7, to reduce noise contributions at the IF frequency.

Figure 8:
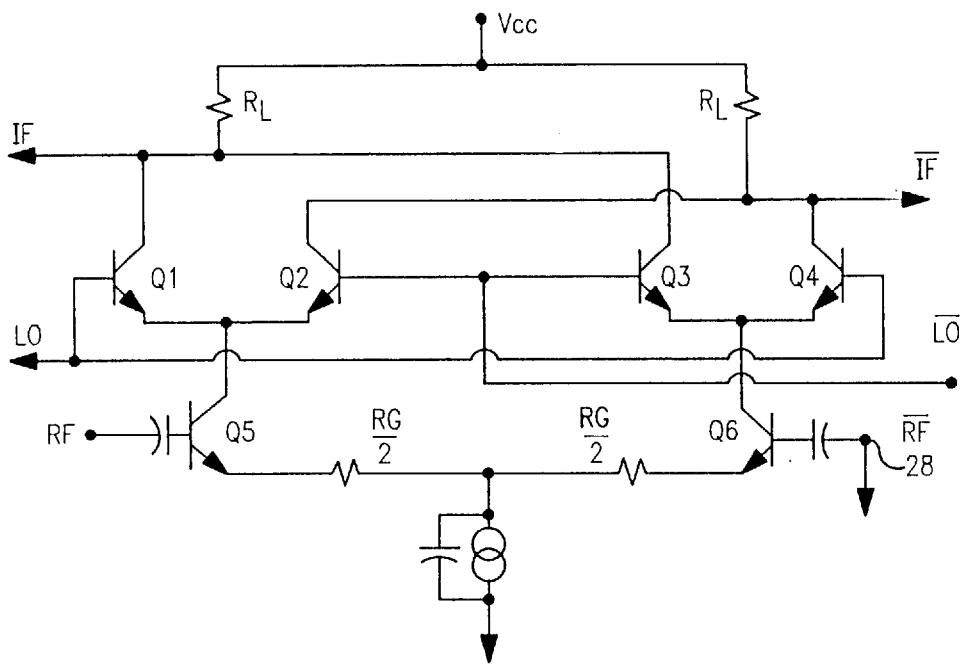
FIG. 8 is a schematic circuit diagram of a prior art double balanced mixer.

As shown in FIG. 8, prior art double balanced mixers typically locate the gain control resistor $R_G$ in the emitter circuit (here shown divided into two resistors each $R_G/2$). The presence of the current source in the emitter circuit diminishes headroom by the voltage drop across the current source.

Figure 9:
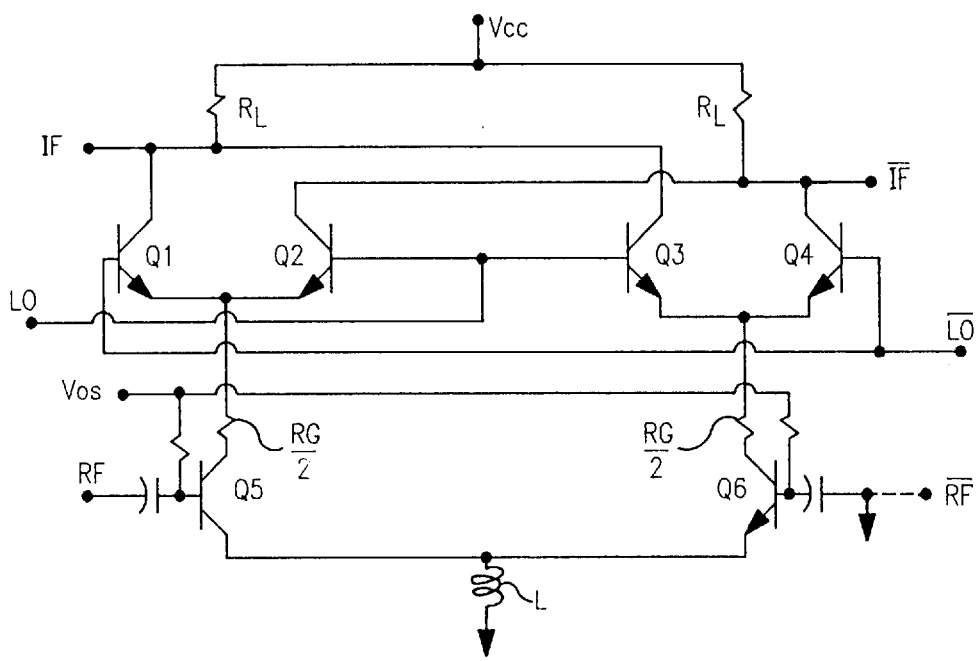
FIG. 9 is a schematic circuit diagram of the double balanced mixer of the present invention.

In accordance with the present invention, and as shown in FIG. 9, bias $V_{cs}$ is provided to the base of the two NPN RF transistors Q5 and Q6. Because the voltage drop across the bias circuit has been obviated, a lower voltage power supply may be used to achieve the same dynamic range as earlier described.

In addition, in a similar manner as with the single balanced mixer, the replacement of the gain control resistor in the emitter circuit with an inductor and the location of the two gain control resistors $R_G/2$ in the collector circuits of the RF transistors Q5 and Q6 has the advantage of controlling gain without substantially affecting the input impedance, the load impedance or the noise figure.

While bipolar transistors have been illustrated, other types of transistors such as MOSFETs may be used so long as they provide the controlled switching and voltage to current conversion described herein.

Figure 11:
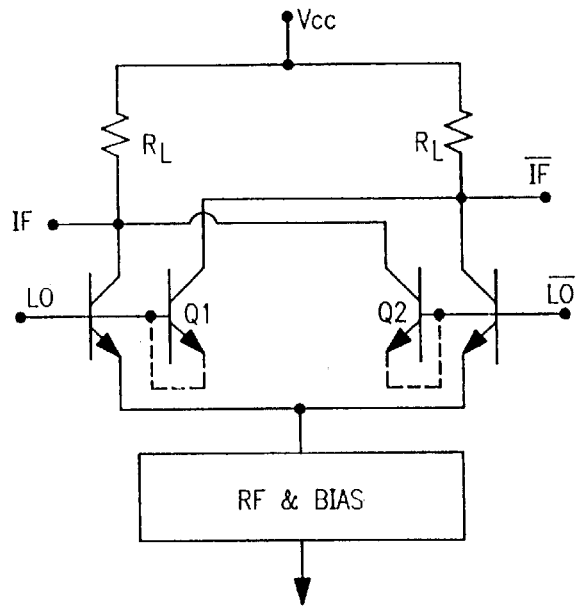
FIG. 11 is a schematic circuit diagram of the switching portion of a single balanced mixer of the present invention with capacitance compensating cross-coupled transistors.
Figure 12:
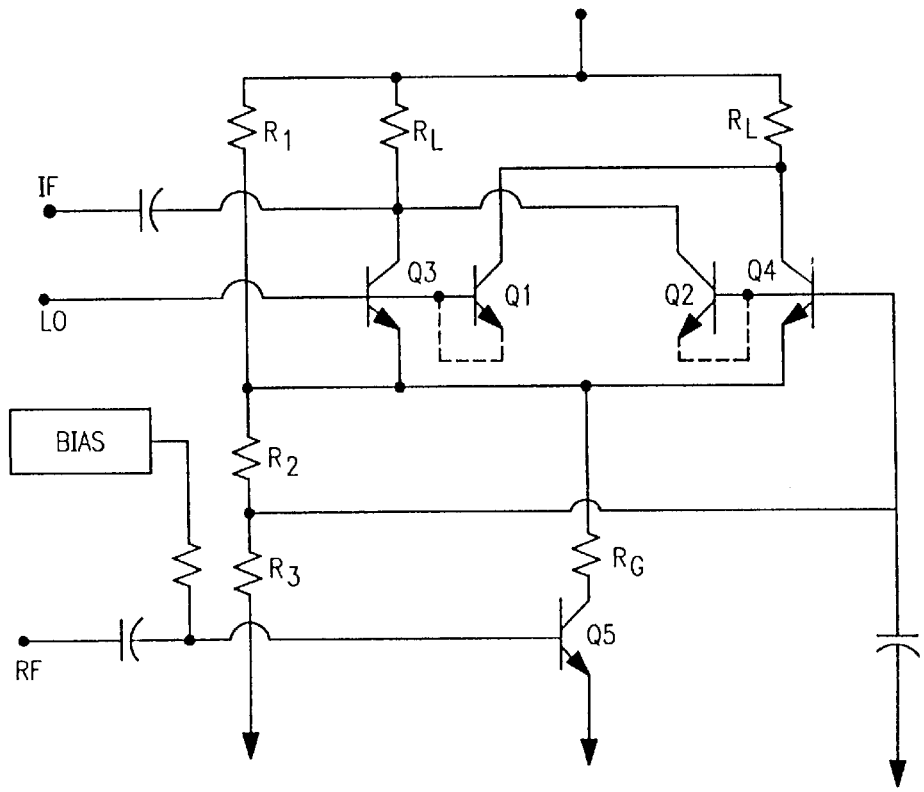
FIG. 12 is a schematic circuit diagram of an unbalanced mixer of the present invention with capacitor compensation.

As earlier discussed, base-collector capacitance compensation of the LO transistors is inherently provided by double balanced mixers. The concept of base-collector capacitance compensation is well known for its application in analog differential amplifier circuits, and is disclosed in greater particularly in Grebene, *Bipolar and MOS Integrated Circuit Design*, John Wiley and Sons, New York, N.Y., 1984. (See pp 415–417) In application to mixers, base-collector capacitance compensation improves the switching speed of the LO switch mechanism. This is accomplished by negating the effects of $C_\mu$ on the bandwidth of the LO circuit. Negating $C_\mu$ raises the bandwidth and therefore increases the switching speed. This improves the conversion efficiency and intercept point of the mixer. In a prior art single balanced mixer such as shown in FIG. 6, or the novel single balanced mixer of FIG. 7, the absence of the second pair of cross-connected transistors slows LO switching and decreases the intercept point. However, and as shown in FIG. 11, a second pair of cross-connected transistors Q1 and Q2 may be added, with the emitters either open circuited or connected to the bases as shown in dashed lines.

Where it is desirable to unbalance the mixer of FIG. 11, it may be done as shown in FIG. 12 by omitting the complementary local oscillator signal LO and grounding the base of Q4 through a coupling capacitor. A resistive voltage divider comprised of resistors $R_1$, $R_2$, and $R_3$ may be provided to differentially bias the bases of the transistors Q3 and Q4.

Because of the differential bias, the capacitor compensation is not as beneficial as in the case of balanced mixers, but may still offer significant improvement in transistor switching time.

In addition, and because of the difference in bias, and thus in conduction, of the two LO transistors Q1 and Q2, most of the power is available at the collector of the transistor Q2 and the bandwidth problems associated with combining the LO and $\overline{LO}$ output signals can be avoided.

Another advantage of the use of the resistive voltage divider of the present invention is that the resister $R_2$ serves not only to provide d.c. bias, by also as the terminating resistor for the grounded base local oscillator stage transistor Q2.

Note that the gain control resistor $R_G$ for the RF transistor Q5 is located in the collector circuit so that gain may be controlled without substantially increasing the noise figure.

Note also that the bias circuit is connected to the base of the RF transistor Q3 rather than in the emitter circuit, thus obviating the loss of headroom.

Single Base Bias For Plural Circuits

Figure 13:
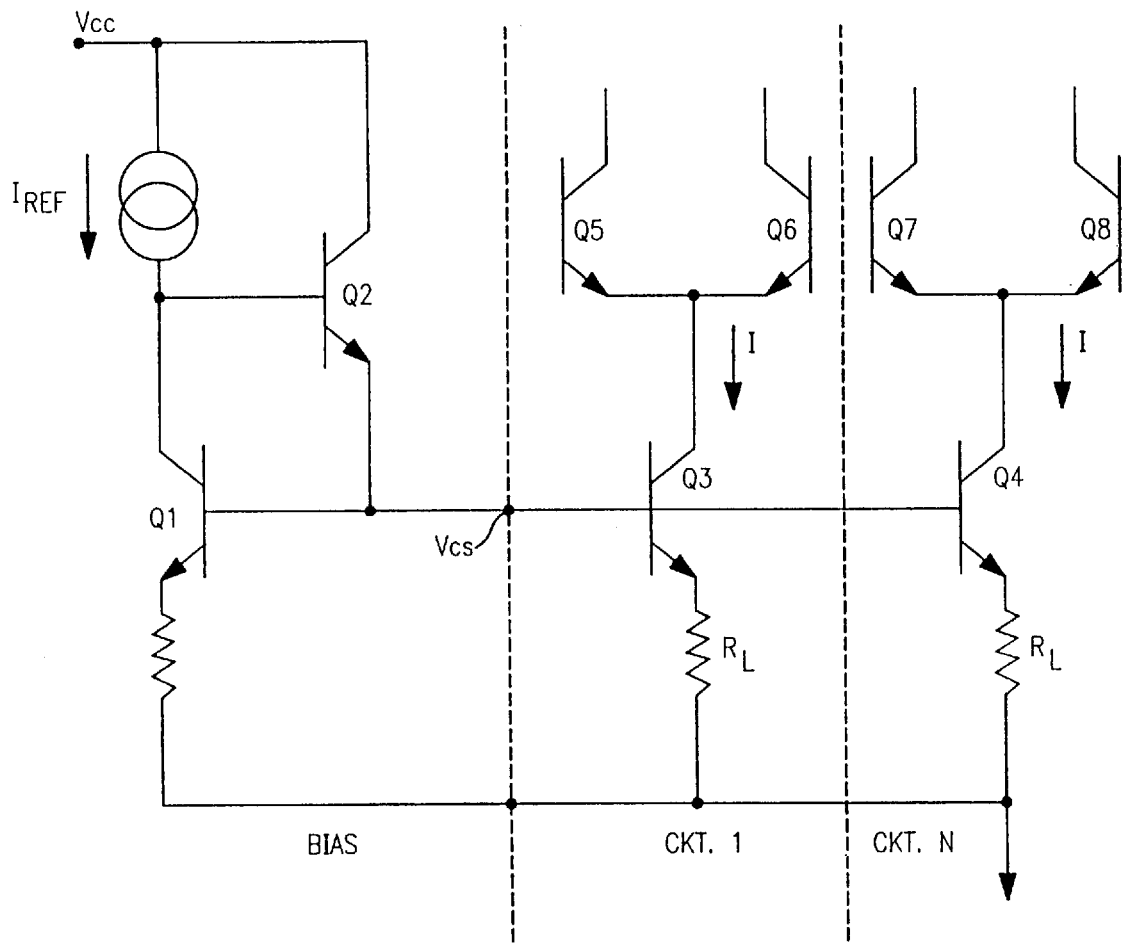
FIG. 13 is a schematic circuit diagram of a prior art single bias block in use with multiple low voltage, analog circuits in other than an common emitter configuration.

As earlier discussed in connection with FIG. 13, single bias circuits have been used for analog circuits in other than a common emitter configuration. However, in accordance with the present invention, and as illustrated in FIG. 5, a single bias circuit may be used to bias a plurality of low voltage, common emitter, radio frequency circuits.

Figure 5:
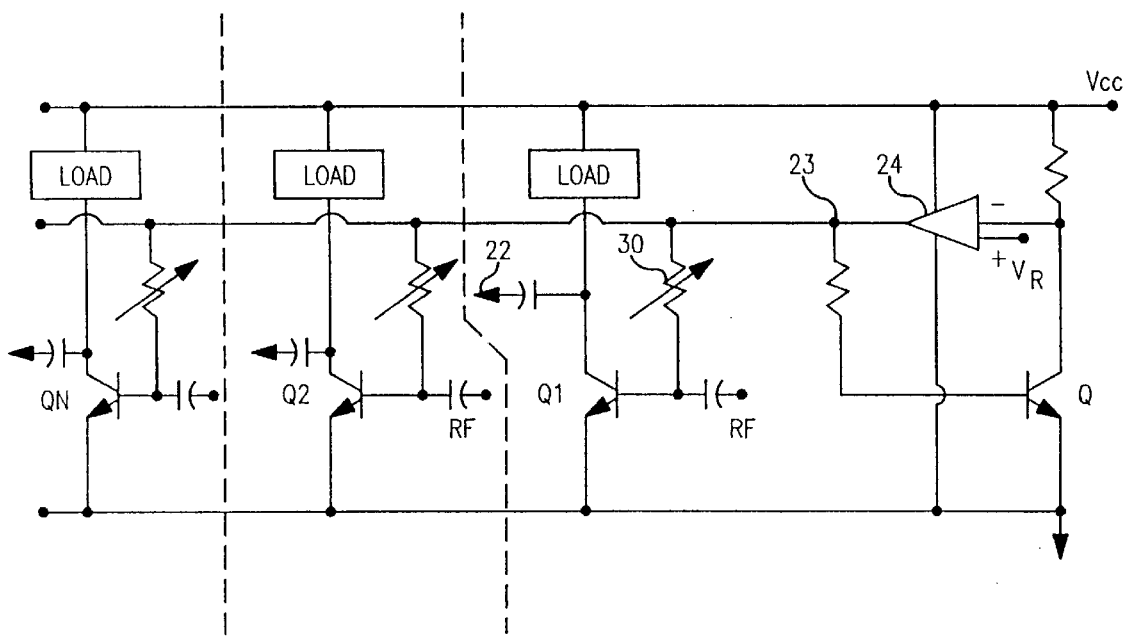
FIG. 5 is a schematic circuit diagram of one embodiment of the low voltage RF amplifier of FIG. 4 illustrating the use of the circuit of FIG. 4 as a reference device for a multiple of grounded emitter circuits such as the RF amplifier of FIG. 4 and mixer circuit of FIGS. 7, 9, 10, 11 and 12.

With reference to FIG. 5, the output terminal 23 of the bias circuit may be connected via a bus to provides the base bias to a plurality of low voltage, common emitter circuits. While two amplifiers are illustrated, the biased circuits may be of any type and number, including one or more amplifiers, one or more mixers and/or one or more additional circuits.

It is necessary to buffer the transistors in the bias circuit, e.g., by the use of an operational amplifier. In FIG. 5, the operational amplifier buffers the transistor Q1 from the effects of the loading of the circuits of the transistors Q2, Q3-QN.

Because the gain of each of the plural amplifiers of FIG. 5 is dependent on the operating temperature of the semiconductors in the circuit as well as process parameters, the effects of $\beta$ and $V_{BE}$ mismatch can be controlled by laser trimming of the bias controlling resistors 30 in the base of each amplifier without substantial degradation of the noise figure, with the load resistor in the collector circuit trimmed for a.c. gain.

ADVANTAGES AND SCOPE OF INVENTION

The present invention has many advantages. For example, the availability of a higher voltage on the collector of a low voltage amplifier increases the dynamic range. Conversely, a desired dynamic range can be obtained with a lower power supply voltage.

Gain can be controlled in a mixer without substantially affecting either the input or output impedance or increasing the noise figure.

Multiple RF stages, e.g., amplifiers and/or mixers, can be biased and temperature compensated by a single circuit, saving important space and power on the integrated circuit chip.

In addition, mixers may be unbalanced without significant loss of power or bandwidth by the differential biasing of the bases of the local oscillator stages.

Further, cross-coupled transistors may be used for capacitor compensation in single balanced and unbalanced mixers.

These and many other advantages will be apparent from the foregoing specification when read in connection with the drawings and the appended claims. While preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

What is claimed is:

1. In a mixer having (a) a local oscillator with semiconductor switching devices connected in series with (b) a bipolar junction transistor having a base, collector and emitter, (c) means for applying a RF signal to the base of said transistor and (d) an impedance for controlling the gain of the mixer, the improvement comprising the operative connection of said gain controlling impedance to the collector of said transistor so that said impedance operates in conjunction with the Miller effect capacitance on the switching devices of the local oscillator to obviate the need for degeneration as a means for gain control.

* * * * *